(12) United States Patent
Cheng et al.

(10) Patent No.: US 9,761,728 B1
(45) Date of Patent: Sep. 12, 2017

(54) SELF-ALIGNED SOURCE/DRAIN JUNCTION FOR VERTICAL FIELD-EFFECT TRANSISTOR (FET) AND METHOD OF FORMING THE SAME

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/164,253

(22) Filed: May 25, 2016

(51) Int. Cl.
  *H01L 29/66* (2006.01)
  *H01L 29/786* (2006.01)
  *H01L 29/423* (2006.01)

(52) U.S. Cl.
  CPC .. *H01L 29/78642* (2013.01); *H01L 29/42392* (2013.01); *H01L 29/66666* (2013.01); *H01L 29/78618* (2013.01); *H01L 29/78696* (2013.01)

(58) Field of Classification Search
  CPC ......... H01L 29/78642; H01L 29/42392; H01L 29/66666; H01L 29/78618; H01L 29/78696
  See application file for complete search history.

(56) References Cited

U.S. PATENT DOCUMENTS

| | | | |
|---|---|---|---|
| 6,828,580 B2 | 12/2004 | Zhang | |
| 6,930,004 B2 | 8/2005 | Wang et al. | |
| 7,132,714 B2 | 11/2006 | Bae et al. | |
| 7,176,089 B2 | 2/2007 | Furukawa et al. | |
| 7,230,286 B2 | 6/2007 | Cohen et al. | |
| 7,749,905 B2 | 7/2010 | Cohen et al. | |
| 8,586,405 B2 | 11/2013 | Zhang et al. | |
| 8,637,849 B2 | 1/2014 | Deligianni et al. | |
| 9,287,362 B1* | 3/2016 | Basu | H01L 29/152 |
| 2015/0035008 A1 | 2/2015 | Kittl et al. | |
| 2016/0343706 A1* | 11/2016 | Chang | H01L 27/0886 |
| 2016/0365347 A1* | 12/2016 | Bao | H01L 27/0924 |
| 2016/0365426 A1* | 12/2016 | Ching | H01L 29/6656 |
| 2017/0005090 A1* | 1/2017 | Ando | H01L 27/0886 |
| 2017/0084712 A1* | 3/2017 | Greene | H01L 29/42368 |

* cited by examiner

*Primary Examiner* — Victor A Mandala
(74) *Attorney, Agent, or Firm* — Vazken Alexanian; Ryan, Mason & Lewis, LLP (57) ABSTRACT

A method for manufacturing a semiconductor device includes forming a bottom source/drain region on a substrate, forming a semiconductor layer on the bottom source/drain region, patterning the semiconductor layer into a plurality of channel regions extending vertically with respect to the substrate, conformally forming a lower dielectric layer on the patterned semiconductor layer, forming a lower spacer layer on a portion of the lower dielectric layer, removing an exposed portion of the lower dielectric layer, forming a gate structure around the plurality of channel regions and on the lower spacer layer, and doping portions of the plurality of channel regions corresponding to the lower spacer layer, wherein the doping comprises diffusing a dopant from the lower dielectric layer into the portions of the plurality of channel regions.

20 Claims, 8 Drawing Sheets

SELF-ALIGNED SOURCE/DRAIN JUNCTION FOR VERTICAL FIELD-EFFECT TRANSISTOR (FET) AND METHOD OF FORMING THE SAME

TECHNICAL FIELD

The field generally relates to semiconductor devices and methods of manufacturing same and, in particular, to a vertical field-effect transistor (FET) having uniform channel doping in spacer regions.

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into fin-like shapes and functions as the channels of the transistors.

Known FinFET devices include fins with source/drain regions on lateral sides of the fins, so that current flows in a horizontal direction (e.g., parallel to a substrate) between source/drain regions at opposite ends of the fins in the horizontal direction. The known structures have their architectures limited by scaling plateaus. For example, known horizontal devices can have contacted poly pitch (CPP) plateaus between 30 nm and 50 nm, and are driven by such competing considerations as electrostatics, contact resistance ($R_{contact}$), and maximum voltage ($V_{max}$). As horizontal devices are scaled down, there is reduced space for metal gate and source/drain contacts, which leads to degraded short-channel control and increased middle of the line (MOL) resistance (e.g., ~15% $I_{eff}$ drop due to MOL resistance for a 7 nm FinFET).

Vertical transport architecture FET devices include source/drain regions at ends of the fins on top and bottom sides of the fins so that current runs through the fins in a vertical direction (e.g., perpendicular to a substrate) from a bottom source/drain region to a top source/drain region. Vertical transport architecture devices are designed to extend the product value proposition beyond conventional plateaus and address the limitations of horizontal device architectures by, for example, decoupling of gate length from the contact gate pitch, providing a FinFET-equivalent density at a larger CPP, and providing lower MOL resistance. Therefore, vertical transistors have been explored as a viable device option for continued complementary metal-oxide semiconductor (CMOS) scaling beyond 7 nm node and are promising for beyond 5 nm technology.

SUMMARY

According to an exemplary embodiment of the present invention, a method for manufacturing a semiconductor device includes forming a bottom source/drain region on a substrate, forming a semiconductor layer on the bottom source/drain region, patterning the semiconductor layer into a plurality of channel regions extending vertically with respect to the substrate, conformally forming a lower dielectric layer on the patterned semiconductor layer, forming a lower spacer layer on a portion of the lower dielectric layer, removing an exposed portion of the lower dielectric layer, forming a gate structure around the plurality of channel regions and on the lower spacer layer, and doping portions of the plurality of channel regions corresponding to the lower spacer layer, wherein the doping comprises diffusing a dopant from the lower dielectric layer into the portions of the plurality of channel regions.

According to an exemplary embodiment of the present invention, a semiconductor device includes a substrate, a bottom source/drain region on a substrate, a plurality of channel regions extending vertically with respect to the substrate, a semiconductor layer between the plurality of channel regions and the bottom source/drain region, a lower dielectric layer on the semiconductor layer and on lower side surfaces of the plurality of channel regions, a lower spacer layer on the lower dielectric layer, and a gate structure around the plurality of channel regions and on the lower spacer layer, wherein portions of the plurality of channel regions corresponding to the lower spacer layer are doped with a dopant from the lower dielectric layer.

According to an exemplary embodiment of the present invention, a method for manufacturing a semiconductor device includes forming a bottom source/drain region on a substrate, forming a semiconductor layer on the bottom source/drain region, patterning the semiconductor layer into a plurality of fins extending vertically with respect to the substrate, wherein the patterning removes a portion of the semiconductor layer to form the plurality of fins, and an unremoved portion of the semiconductor layer remains between the plurality of fins and the bottom source/drain region, conformally forming a lower dielectric layer on the plurality of fins and on the unremoved portion of the semiconductor layer, forming a lower spacer layer on a portion of the lower dielectric layer, removing an exposed portion of the lower dielectric layer, forming a gate structure around the plurality of fins and on the lower spacer layer, and doping portions of the plurality of fins corresponding to the lower spacer layer, wherein the doping comprises diffusing a dopant from the lower dielectric layer into the portions of the plurality of channel fins.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to a vertical field-effect transistor (FET) having uniform channel doping in spacer regions.

In a vertical FET, the doping under a bottom spacer and into the channel region is critical for the FET's electrical uniformity. Due to fin etching variation, a vertical FET's under-spacer and channel doping can be non-uniform if the spacer and channel doping is performed via diffusion from a heavily doped source/drain region.

Embodiments of the present invention relate to a self-aligned source/drain junction for a vertical FET and method of forming same, which results in uniform channel doping in spacer regions. According to an exemplary embodiment of the present invention, upper and lower portions of fins or nanowires in regions corresponding to spacers are uniformly doped due to dopant diffusion from self-aligned dielectric layers comprising, for example, PSG (phospho-silicate glass), BSG (boro-silicate glass) or BPSG (boro-phospho-silicate glass). The dopant diffusion from the sides of the fins or nanowires via the self-aligned dielectric layers in the spacer regions results in more uniform doping than doping only from a bottom or top side via diffusion heavily doped bottom or top source/drain regions. Due to greater distances to travel during diffusion from a bottom or top side of fins or nanowires, channel doping via diffusion from bottom or top source/drain regions in conventional arrangements is non-uniform. Due to a relatively narrow left to right width of fins or nanowires, dopant diffused via side portions of the fins or nanowires from the self-aligned dielectric layers has a smaller distance to travel than dopant diffused from a bottom or top side of the fins or nanowires, resulting in uniform dopant concentrations in the doped channel regions. In addition, the sides of the fins or nanowires on which the dielectric layers are located provide more surface area for diffusion than the top or bottom sides of the fins or nanowires.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Figure 1:
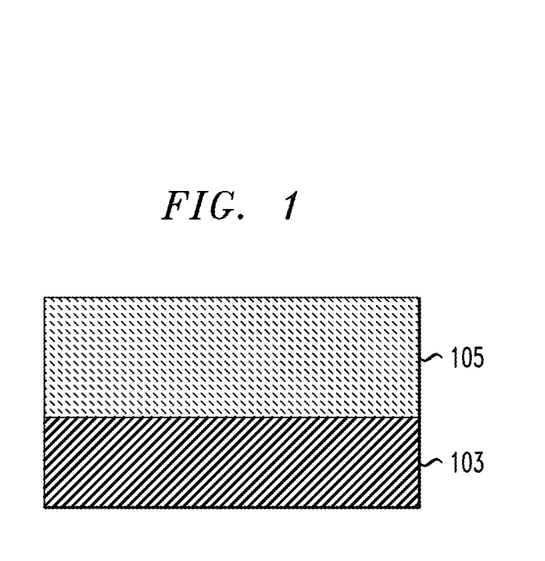
FIG. 1 is a cross-sectional view illustrating formation of a doped semiconductor layer on a substrate to form a bottom source/drain region in a method for manufacturing a semiconductor device, according to an exemplary embodiment of the present invention.
Figure 2:
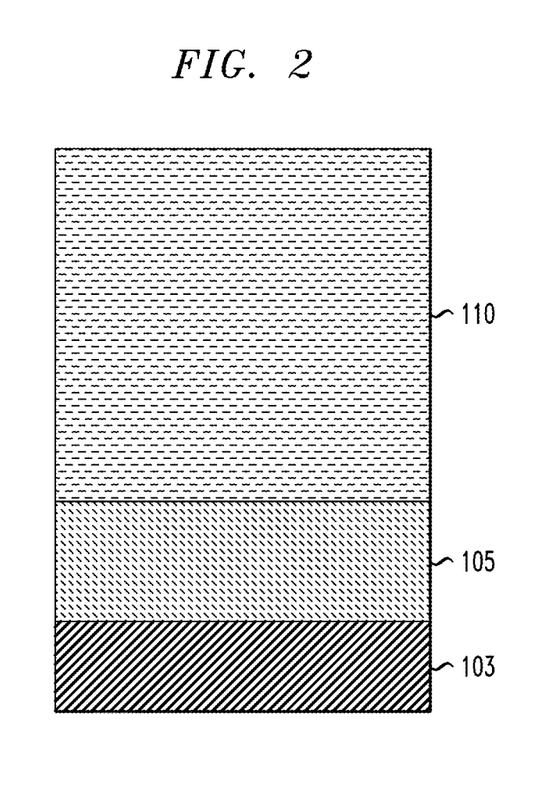
FIG. 2 is a cross-sectional view illustrating formation of an undoped semiconductor layer in a method for manufacturing a semiconductor device, according to an exemplary embodiment of the present invention.

FIG. 1 is a cross-sectional view illustrating formation of a doped semiconductor layer on a substrate to form a bottom source/drain region, and FIG. 2 is a cross-sectional view illustrating formation of an undoped semiconductor layer on the doped semiconductor layer in a method for manufacturing a semiconductor device, according to an exemplary embodiment of the present invention.

A fin of a FinFET can include, for example, silicon, and is a conducting channel that protrudes vertically from a substrate and conducts in a direction from a source to a drain. As can be understood by one of ordinary skill in the art, a plurality of fins can be formed on the substrate 101 and spaced apart from each other at regular intervals. A plurality of gates can intersect the fins.

Referring to FIG. 1, a semiconductor substrate 103 can be, for example, a bulk substrate including semiconductor material including, but not limited to, silicon (Si), silicon germanium (SiGe), strain-relaxed buffer (SRB) SiGe, silicon carbide (SiC), silicon-germanium-carbon (SiGeC) or other like semiconductor. Although silicon is an often used semiconductor material in wafer fabrication, alternative semiconductor materials can be employed, such as, but not limited to, germanium, gallium arsenide, gallium nitride, silicon germanium, cadmium telluride and zinc selenide. In addition, multiple layers of the semiconductor materials can be used as the semiconductor material of the substrate.

In accordance with an embodiment of the present invention, the substrate 103 is a bulk silicon substrate, and an n+ or p+ doped semiconductor layer 105 and an undoped semiconductor layer 110 are epitaxially grown on the substrate 103. The doped semiconductor layer 105 can include, but is not necessarily limited to, Si, SiGe or SiC. The undoped semiconductor layer 110, also referred to herein as a channel layer, can include, but is not necessarily limited to, Si, SiGe or III-V materials. In accordance with an embodiment, the layer 110 comprises, but is not limited to, silicon or III-V materials for an n-type FET (nFET) and Si, SiGe or III-V materials for a p-type FET (pFET).

Doping of the semiconductor layer 105 can be performed using, for example, ion implantation, or annealing if not using an epitaxial process. In a non-limiting illustrative example, the doping of the layer 105 uses, for example, arsenic (As) or phosphorous (P) for an n-type device (e.g., nFET), and boron (B) for a p-type device (e.g., pFET), at concentrations in the general range of e20/cm$^3$. The doped semiconductor layer 105 functions as a bottom source/drain region of a resulting vertical FET.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

Figure 3:
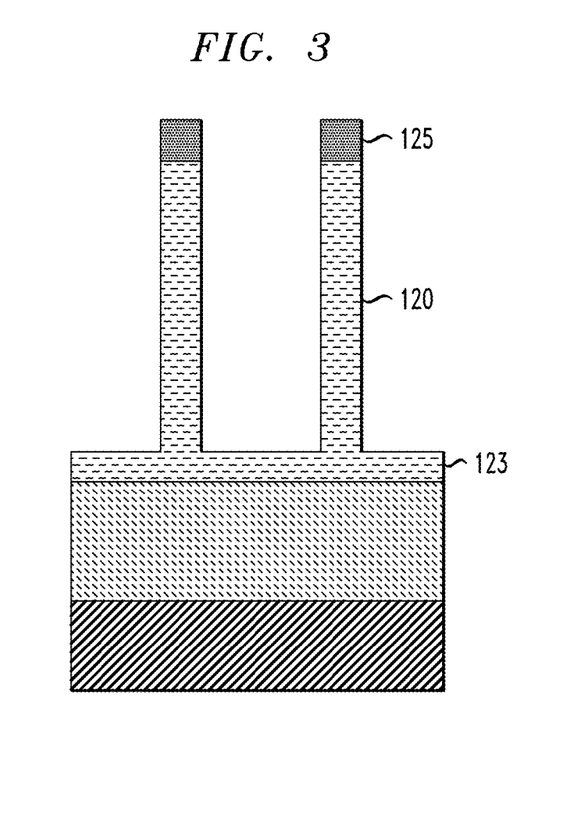
FIG. 3 is a cross-sectional view illustrating fin formation in a method for manufacturing a semiconductor device, according to an exemplary embodiment of the present invention.

FIG. 3 is a cross-sectional view illustrating fin formation in a method for manufacturing a semiconductor device, according to an exemplary embodiment of the present invention. Fins, such as a fin 120, can be formed by patterning the semiconductor layer 110 into the fins 120. A hardmask 125 including, for example, a dielectric material, such as silicon nitride (SiN) is formed on portions that are to be formed into the fins 120. The fin patterning can be done by a spacer image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography defined mandrel to spacers, where the pattern density is doubled. The spacer pattern can be used as the hardmask 125 to form the fins 120 by RIE processes.

As illustrated in FIG. 3, the fin etching stops within the undoped semiconductor layer 110 so that a portion 123 of the layer 110 remains on layer 105 at the base of the fins 120. A height of the portion 123 with respect to the layer 105 can be, for example, in the range of about 5 nm to about 10 nm. According to an embodiment, the fins 120 can be patterned to a height of about 10 nm to about 100 nm with respect to the portion 123. While embodiments of the present invention describe channel regions as fins, the embodiments are not necessarily limited to fin channel regions, and may also include nanowire channel regions.

Figure 4:
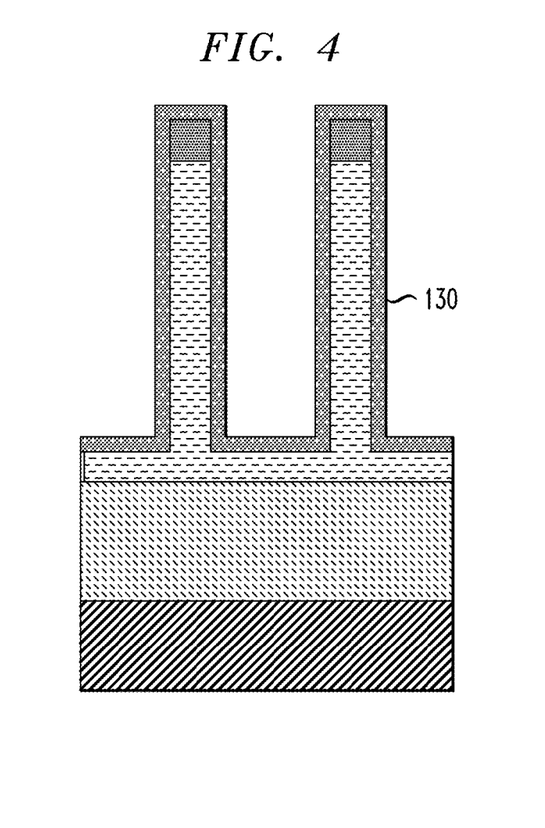
FIG. 4 is a cross-sectional view illustrating formation of a lower conformal dielectric layer in a method for manufacturing a semiconductor device, according to an exemplary embodiment of the present invention.

FIG. 4 is a cross-sectional view illustrating formation of a lower conformal dielectric layer in a method for manufacturing a semiconductor device, according to an exemplary embodiment of the present invention. As shown in FIG. 4, a conformal dielectric 130 is deposited using deposition techniques including, but not limited to, chemical vapor deposition (CVD), plasma-enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating. According to an embodiment, the dielectric includes, but is not necessarily limited to, a PSG (phospho-silicate glass), a BSG (boro-silicate glass) or a BPSG (boro-phospho-silicate glass) film. In accordance with an embodiment of the present invention, the dielectric 130 is doped with, for example, boron and/or phosphorous during deposition. The dopant concentrations of the PSG, BSG or BPSG can be for example in the general range of e17 to e22/cm$^3$ for both boron and phosphorus dopants.

Figure 5:
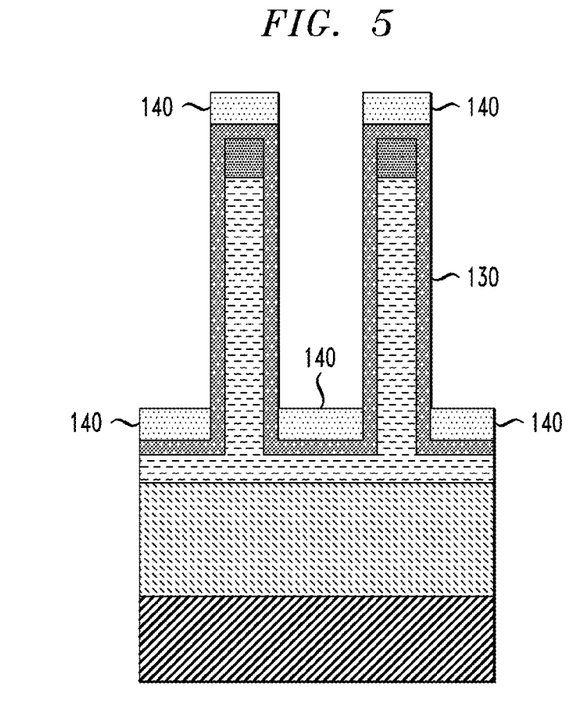
FIG. 5 is a cross-sectional view illustrating formation of bottom spacer layers in a method for manufacturing a semiconductor device, according to an exemplary embodiment of the present invention.

FIG. 5 is a cross-sectional view illustrating formation of bottom spacer layers in a method for manufacturing a semiconductor device, according to an exemplary embodiment of the present invention. According to an embodiment of the present invention, bottom spacer dielectric layers 140, such as, for example plasma enhanced chemical vapor deposition (PECVD)-type, high aspect ratio process (HARP)-type or high density plasma (HDP)-type low-K dielectric layers, including, but not limited to, silicon boron nitride (SiBN), siliconborocarbonitride (SiBCN), silicon oxycarbonitride (SiOCN), SiN or SiO2, are deposited on the layer 130 and on the stacked structures including the fins 120 and the hardmasks 125 using, for example, a directional deposition technique, including, but not necessarily limited to, a gas cluster ion beam (GCIB) or other directional process. The directional deposition results in bottom spacer layers 140 that correspond to horizontal portions, including portions on the dielectric layer 130 adjacent lower portions of the fins 120 and over the hardmasks 125.

Figure 6:
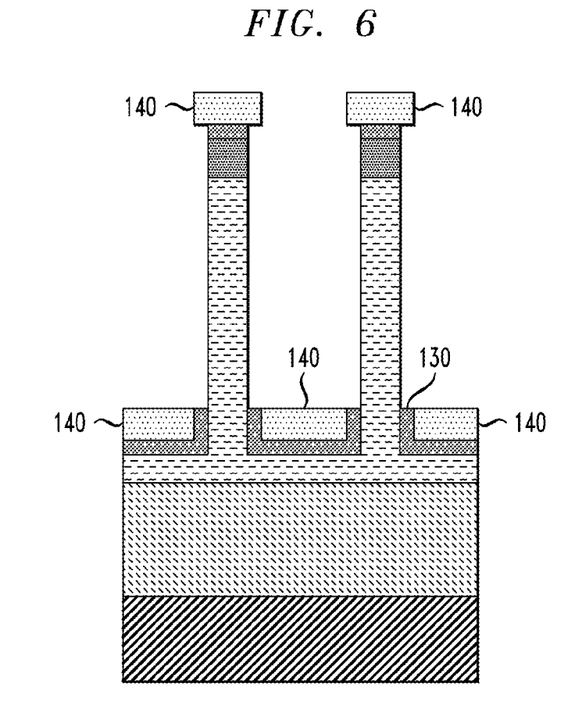
FIG. 6 is a cross-sectional view illustrating selective removal of part of the lower conformal dielectric layer in a method for manufacturing a semiconductor device, according to an exemplary embodiment of the present invention.

FIG. 6 is a cross-sectional view illustrating selective removal of part of the lower conformal dielectric layer in a method for manufacturing a semiconductor device, according to an exemplary embodiment of the present invention. As shown in FIG. 6, the dielectric layer 130 is selectively removed from portions of the sides of the fins 120 and hardmasks 125. The selective removal of the dielectric layer 130 from these portions can be performed using an etching process, for example, a wet etch process containing hydrofluoric acid (HF).

Figure 7:
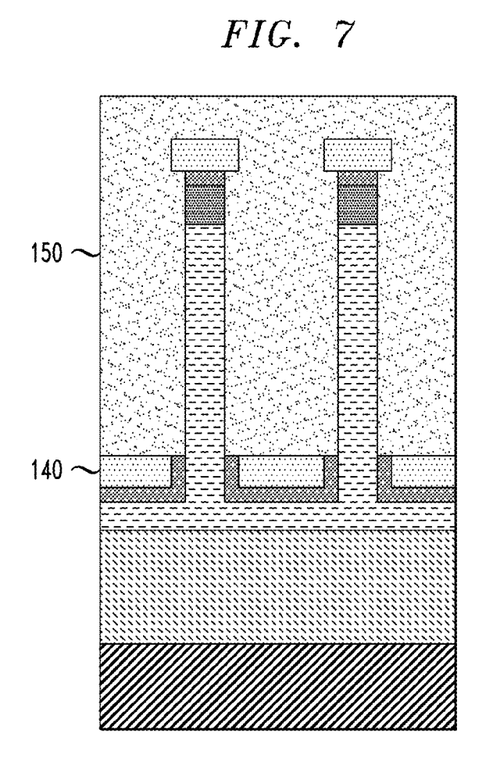
FIG. 7 is a cross-sectional view illustrating formation of dielectric isolation layer in a method for manufacturing a semiconductor device, according to an exemplary embodiment of the present invention.
Figure 8:
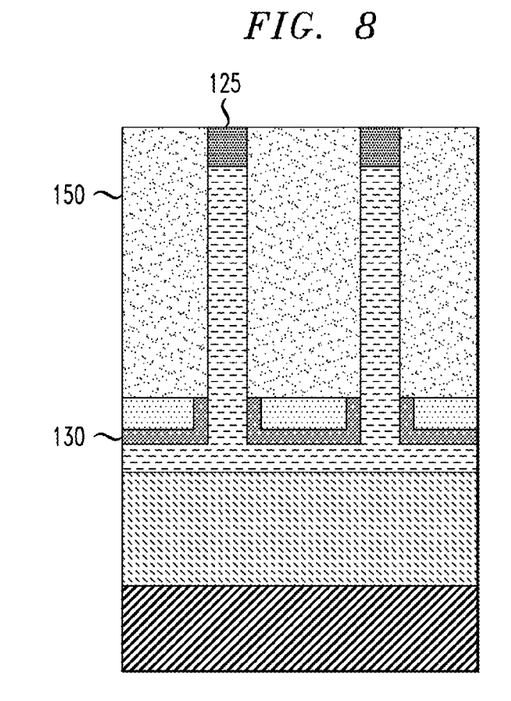
FIG. 8 is a cross-sectional view illustrating planarization of the dielectric isolation layer in a method for manufacturing a semiconductor device, according to an exemplary embodiment of the present invention.

FIG. 7 is a cross-sectional view illustrating formation of dielectric isolation layer, and FIG. 8 is a cross-sectional view illustrating planarization of the dielectric isolation layer in a method for manufacturing a semiconductor device, according to an exemplary embodiment of the present invention. As shown in FIG. 7, a dielectric layer 150, including, but not limited to SiO$_2$, low-temperature oxide (LTO), high-temperature oxide (HTO), flowable oxide (FOX) or some other dielectric, is deposited on the structure from FIG. 6 using deposition techniques including, but not limited to, CVD, PECVD, RFCVD, PVD, ALD, MLD, MBD, PLD, and/or LSMCD, sputtering, and/or plating. Referring to FIG. 8, planarization, for example, chemical mechanical planarization (CMP), can be performed to remove excess portions of layer 150, as well as the part of the dielectric layer 130 on the hardmasks 125 and the spacer layers 140 on the part of the dielectric layer 130 on the hardmasks 125.

Figure 9:
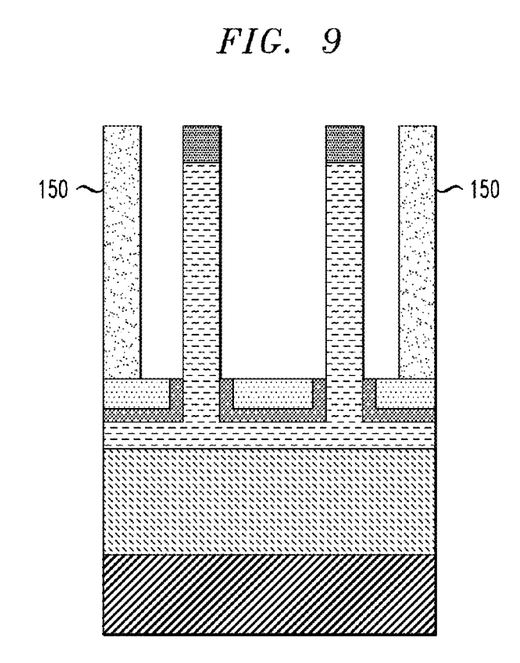
FIG. 9 is a cross-sectional view illustrating removal of portions of the dielectric isolation layer to form a gate region in a method for manufacturing a semiconductor device, according to an exemplary embodiment of the present invention.

FIG. 9 is a cross-sectional view illustrating removal of portions of the dielectric isolation layer 150 to form a gate region in a method for manufacturing a semiconductor device, according to an exemplary embodiment of the present invention. As shown in FIG. 9, portions of the dielectric isolation layer 150 where a gate structure is to be formed are removed down to the bottom spacer layers 140 using, for example, an anisotropic etch process, such as ME, ion beam etching, plasma etching or laser ablation. In accordance with an embodiment, the portions of the dielectric isolation layer 150 can be removed using, for example, a dry etch process containing fluorocarbon.

Figure 10:
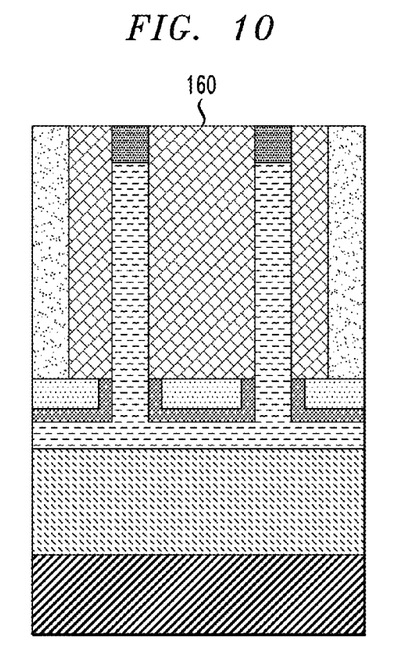
FIG. 10 is a cross-sectional view illustrating formation and planarization of a gate structure in a method for manufacturing a semiconductor device, according to an exemplary embodiment of the present invention.

FIG. 10 is a cross-sectional view illustrating formation and planarization of a gate structure in a method for manufacturing a semiconductor device, according to an exemplary embodiment of the present invention. As shown in FIG. 10, a gate structure 160 is formed in the region where the dielectric isolation layer 150 was removed on the bottom spacer layers 140 and on the dielectric layers 130. According to an embodiment, the gate structure 160 includes a gate dielectric layer, such as a high-K dielectric layer including, but not necessarily limited to, HfO$_2$ (hafnium oxide), ZrO$_2$ (zirconium dioxide), hafnium zirconium oxide, Al$_2$O$_3$ (aluminum oxide), and Ta$_2$O$_5$ (tantalum pentoxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layer may further include dopants such as, for example, lanthanum and aluminum. According to an embodiment, the gate structure 160 further includes a work-function metal (WFM) layer on the high-K dielectric layer, including but not limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN.

According to an embodiment, the gate structure 160 further includes a gate layer on the WFM layer and on the high-K dielectric layer. The gate layer includes, but is not necessarily limited to, amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structure 160 may be formed using, for example, deposition techniques including, but not limited to, CVD, PECVD, RFCVD, PVD, ALD, MLD, MBD, PLD, and/or LSMCD, sputtering, and/or plating, followed by a planarization process, such as CMP to remove excess upper portions of the gate structure 160. Planarization can be performed down to the hardmasks 125.

Figure 11:
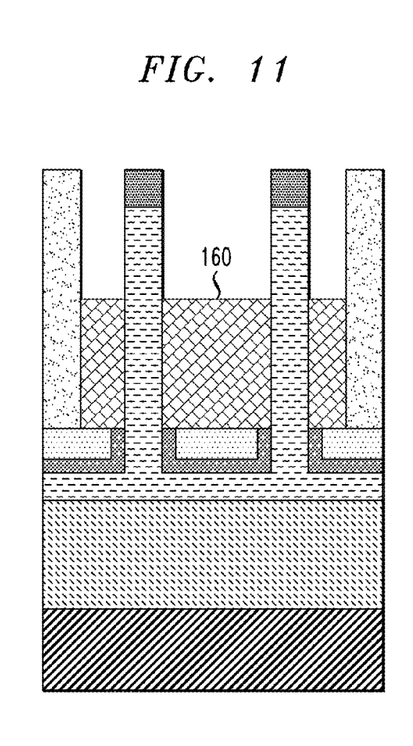
FIG. 11 is a cross-sectional view illustrating recessing of the gate structure in a method for manufacturing a semiconductor device, according to an exemplary embodiment of the present invention.

FIG. 11 is a cross-sectional view illustrating recessing of the gate structure in a method for manufacturing a semiconductor device, according to an exemplary embodiment of the present invention. As shown in FIG. 11, portions of the gate structure 160 are removed using, for example, an anisotropic etch process, such as RIE, ion beam etching, plasma etching or laser ablation. As can be seen, the gate structure 160 is recessed to a lower height above the substrate 103. According to an embodiment, recessing is performed by a wet or dry etching process that is selective with respect to materials of the fins 120 and the dielectric isolation layers 150. Etch chemistry for recessing the gate structure 160 can include, for example, sulfur hexafluoride ($SF_6$) and nitrogen ($N_2$).

Figure 12:
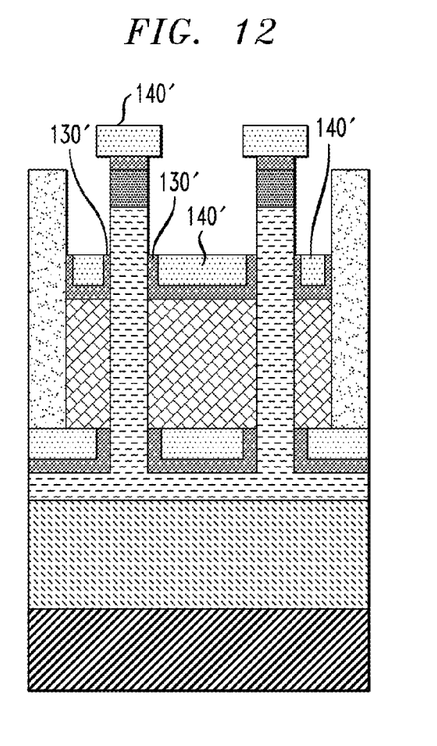
FIG. 12 is a cross-sectional view illustrating formation of an upper conformal dielectric layer and an upper spacer layer in a method for manufacturing a semiconductor device, according to an exemplary embodiment of the present invention.

FIG. 12 is a cross-sectional view illustrating formation of upper conformal dielectric layers and upper spacer layers in a method for manufacturing a semiconductor device, according to an exemplary embodiment of the present invention. As shown in FIG. 12, upper conformal dielectric layers 130' and upper spacer layers 140' are formed on the recessed gate structure 160 and on the hardmasks 125. Formation of the upper conformal dielectric layers 130' and upper spacer layers 140' is similar to the processing described in connection with FIGS. 4-6. The conformal dielectric 130' is deposited using deposition techniques including, but not limited to, chemical vapor deposition (CVD), plasma-enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating, and includes, but is not necessarily limited to, PSG, BSG or BPSG. In accordance with an embodiment of the present invention, the dielectric 130' is doped with, for example, boron and/or phosphorous during deposition.

The upper spacer dielectric layers 140' can include, but are not necessarily limited to, PECVD-type, HARP-type or HDP-type low-K dielectric layers, including, but not limited to, SiBN, SiBCN, SiOCN, SiN or SiO2, and are deposited on the layer 130' and on the stacked structures including the fins 120 and the hardmasks 125 using, for example, a directional deposition technique, including, but not necessarily limited to, a GCIB or other directional process. The directional deposition results in upper spacer layers 140' that correspond to horizontal portions. Similar to the processing in FIG. 6, the dielectric layer 130' is selectively removed from portions of the sides of the fins 120 and hardmasks 125 to result in the structure in FIG. 12.

Figure 13:
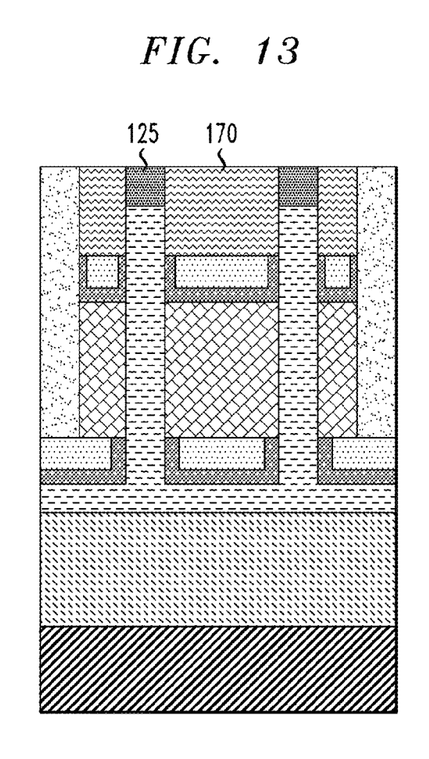
FIG. 13 is a cross-sectional view illustrating formation of a sacrificial dielectric layer in a method for manufacturing a semiconductor device, according to an exemplary embodiment of the present invention.

FIG. 13 is a cross-sectional view illustrating formation of a sacrificial dielectric layer in a method for manufacturing a semiconductor device, according to an exemplary embodiment of the present invention. As shown in FIG. 13, a sacrificial dielectric layer 170, including, but not limited to silicon nitride or some other dielectric, is deposited on the structure from FIG. 12 using deposition techniques including, but not limited to, CVD, PECVD, RFCVD, PVD, ALD, MLD, MBD, PLD, and/or LSMCD, sputtering, and/or plating. Planarization, for example, CMP, can be performed to remove excess portions of layer 170, as well as the part of the dielectric layer 130' on the hardmasks 125 and the spacer layers 140' on the part of the dielectric layer 130' on the hardmasks 125.

Figure 14:
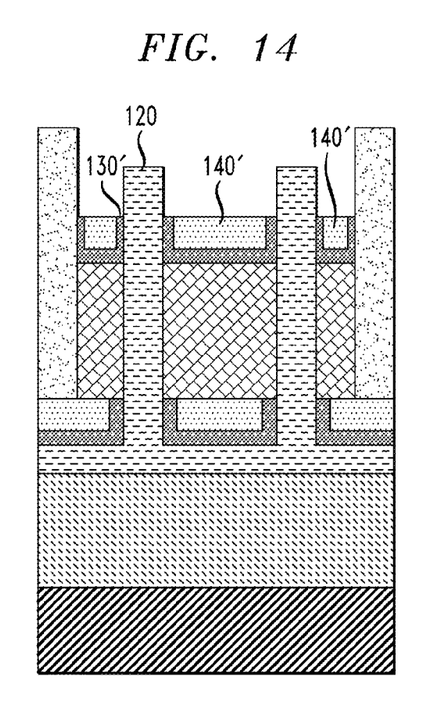
FIG. 14 is a cross-sectional view illustrating removal of a sacrificial dielectric layer and hardmasks in a method for manufacturing a semiconductor device, according to an exemplary embodiment of the present invention.

FIG. 14 is a cross-sectional view illustrating removal of the sacrificial dielectric layer 170 and hardmasks 125 in a method for manufacturing a semiconductor device, according to an exemplary embodiment of the present invention. As shown in FIG. 14, the hardmasks 125 and sacrificial dielectric layer 170 are selectively removed, using for example, a selective etch process. The selective etch process can include, for example, a wet etch process containing phosphoric acid at a temperature around 80 degrees Celsius. According to an embodiment, the hardmask and dielectric layers 125, 170 include the same or similar material so that these layers 125, 170 can be selectively etched with respect to the other structures.

Figure 15:
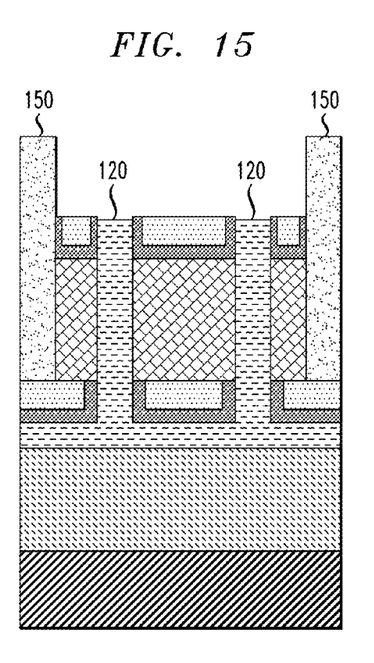
FIG. 15 is a cross-sectional view illustrating recessing of fins in a method for manufacturing a semiconductor device, according to an exemplary embodiment of the present invention.

FIG. 15 is a cross-sectional view illustrating recessing of fins in a method for manufacturing a semiconductor device, according to an exemplary embodiment of the present invention. As shown in FIG. 15, portions of the fins are removed using, for example, an anisotropic etch process, such as RIE, ion beam etching, plasma etching or laser ablation. As can be seen, the fins 120 are recessed to a height above the substrate 103 near an upper surface of the dielectric and spacer layer structure 130', 140'. The recessing can result in a height of the fins 120 which is at, or slightly above or below the upper surface of the dielectric and spacer layer structure 130', 140'. According to an embodiment, recessing is performed by a wet or dry etching process that is selective with respect to materials of the dielectric and spacer layers 130', 140' and the dielectric isolation layers 150. Etch chemistry for recessing the fins 120 can include, for example, chlorine gas. According to an embodiment of the present invention, the recessing of the fins 120 described in connection with FIG. 15 is not performed, and the method proceeds from the steps described in connection with FIG. 14 to the epitaxial growth of a top source/drain region described in connection with FIG. 16 without recessing the fins 120.

Figure 16:
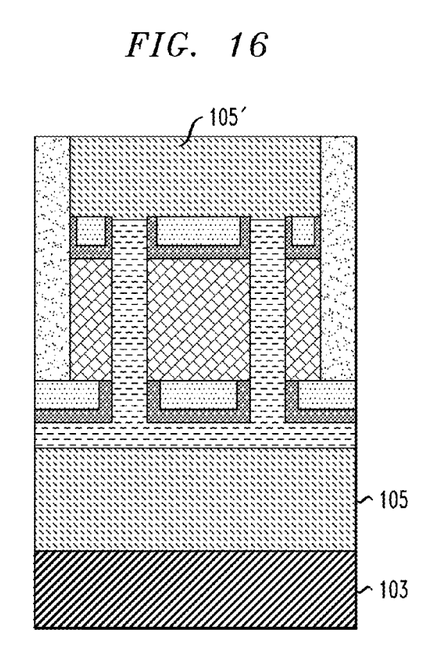
FIG. 16 is a cross-sectional view illustrating epitaxial growth of a top source/drain region in a method for manufacturing a semiconductor device, according to an exemplary embodiment of the present invention.

FIG. 16 is a cross-sectional view illustrating epitaxial growth of a top source/drain region in a method for manufacturing a semiconductor device, according to an exemplary embodiment of the present invention. As shown in FIG. 16, top source/drain region 105' is epitaxially grown on the fins 120 and on the dielectric and spacer layers 130', 140' between dielectric isolation layers 150. In accordance with an embodiment of the present invention, for an nFET, an As or P doped Si or SiC source/drain region 105' is epitaxially grown. For a pFET, a B doped SiGe or Si source/drain region 105' is epitaxially grown. Doping can be at concentrations in the general range of e19 to $e21/cm^3$.

Figure 17:
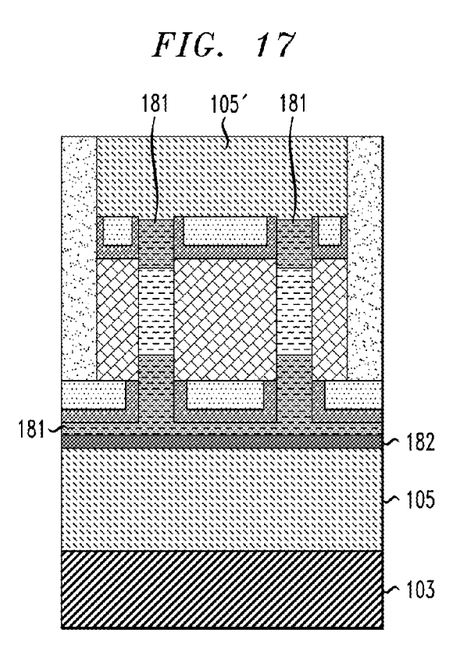
FIG. 17 is a cross-sectional view illustrating doping in a method for manufacturing a semiconductor device, according to an exemplary embodiment of the present invention.

FIG. 17 is a cross-sectional view illustrating doping in a method for manufacturing a semiconductor device, according to an exemplary embodiment of the present invention. As shown in FIG. 17, referring to shaded portions 181, the upper and lower portions of the fins 120 in the regions corresponding to the spacers 140, 140', are uniformly doped due to dopant diffusion from the self-aligned dielectric layers 130' and 130 comprising, for example, BSG, PSG or BPSG. The dopant diffusion from the sides of the fins 120 via the self-aligned dielectric layers 130', 130 in the spacer regions results in more uniform doping than doping only from a bottom or top side via diffusion from bottom or top source/drain regions. Due to greater distances to travel during diffusion from a bottom or top side of the fins 120, the channel doping via diffusion bottom or top source/drain regions is non-uniform. For example, as shown by darker shaded region 182 than shaded region 181, a doping concentration is higher closer to the source/drain region 105 where there are no self-aligned dielectric layers. Due to a relatively narrow left to right width of the fins 120 (e.g., 6 nm, but not limited thereto), dopant diffused via side portions of the fins 120 from the self-aligned dielectric layers 130', 130 has a smaller distance to travel than dopant diffused from a bottom or top side of the fins 120, resulting in uniform dopant concentrations as shown by shaded areas 181 when doping is performed via the self-aligned dielectric layers 130', 130 in accordance with embodiments of the present invention. In addition, the sides of the fins 120 on which the dielectric layers 130', 130 are located provide more surface area for diffusion than the top or bottom sides of the fins 120. Dopant diffusion can occur as a result of a drive-in annealing process.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a bottom source/drain region on a substrate;
   forming a semiconductor layer on the bottom source/drain region;
   patterning the semiconductor layer into a plurality of channel regions extending vertically with respect to the substrate;
   conformally forming a lower dielectric layer on the patterned semiconductor layer;
   forming a lower spacer layer on a portion of the lower dielectric layer;
   removing an exposed portion of the lower dielectric layer;
   forming a gate structure around the plurality of channel regions and on the lower spacer layer; and
   doping portions of the plurality of channel regions corresponding to the lower spacer layer, wherein the doping comprises diffusing a dopant from the lower dielectric layer into the portions of the plurality of channel regions.

2. The method according to claim 1, wherein the lower dielectric layer comprises at least one of PSG (phospho-silicate glass), BSG (boro-silicate glass) and BPSG (boro-phospho-silicate glass).

3. The method according to claim 1, wherein the patterning removes a portion of the semiconductor layer to form the plurality of channel regions, and wherein an unremoved portion of the semiconductor layer remains between the plurality of channel regions and the bottom source/drain region.

4. The method according to claim 3, wherein a height of the unremoved portion with respect to the bottom source/drain region is about 5 nm to about 10 nm.

5. The method according to claim 3, wherein the lower dielectric layer is formed on the unremoved portion of the semiconductor layer.

6. The method according to claim 1, further comprising:
   recessing the gate structure; and
   conformally forming an upper dielectric layer on the plurality of channel regions and on the recessed gate structure.

7. The method according to claim 6, further comprising forming an upper spacer layer on a portion of the upper dielectric layer.

8. The method according to claim 7, further comprising doping portions of the plurality of channel regions corresponding to the upper spacer layer, wherein the doping comprises diffusing a dopant from the upper dielectric layer into the portions of the plurality of channel regions corresponding to the upper spacer layer.

9. The method according to claim 8, wherein the upper dielectric layer comprises at least one of PSG (phospho-silicate glass), BSG (boro-silicate glass) and BPSG (boro-phospho-silicate glass).

10. The method according to claim 7, further comprising forming a top source/drain region on the upper spacer layer and the plurality of channel regions.

11. A semiconductor device, comprising:
    a substrate;
    a bottom source/drain region on a substrate;
    a plurality of channel regions extending vertically with respect to the substrate;
    a semiconductor layer between the plurality of channel regions and the bottom source/drain region;
    a lower dielectric layer on the semiconductor layer and on lower side surfaces of the plurality of channel regions;
    a lower spacer layer on the lower dielectric layer; and
    a gate structure around the plurality of channel regions and on the lower spacer layer;
    wherein portions of the plurality of channel regions corresponding to the lower spacer layer are doped with a dopant from the lower dielectric layer.

12. The semiconductor device according to claim 11, wherein the lower dielectric layer comprises at least one of PSG (phospho-silicate glass), BSG (boro-silicate glass) and BPSG (boro-phospho-silicate glass).

13. The semiconductor device according to claim 11, wherein a height of the semiconductor layer with respect to the bottom source/drain region is about 5 nm to about 10 nm.

14. The semiconductor device according to claim 11, further comprising:
    an upper dielectric layer on the gate structure and on upper side surfaces of the plurality of channel regions; and
    an upper spacer layer on the upper dielectric layer.

15. The semiconductor device according to claim 14, wherein portions of the plurality of channel regions corresponding to the upper spacer layer are doped with a dopant from the upper dielectric layer.

16. The semiconductor device according to claim 15, wherein the upper dielectric layer comprises at least one of PSG (phospho-silicate glass), BSG (boro-silicate glass) and BPSG (boro-phospho-silicate glass).

17. The semiconductor device according to claim 14, further comprising a top source/drain region on the upper spacer layer and the plurality of channel regions.

18. A method for manufacturing a semiconductor device, comprising:
    forming a bottom source/drain region on a substrate;
    forming a semiconductor layer on the bottom source/drain region;
    patterning the semiconductor layer into a plurality of fins extending vertically with respect to the substrate, wherein the patterning removes a portion of the semiconductor layer to form the plurality of fins, and an unremoved portion of the semiconductor layer remains between the plurality of fins and the bottom source/drain region;

conformally forming a lower dielectric layer on the plurality of fins and on the unremoved portion of the semiconductor layer;

forming a lower spacer layer on a portion of the lower dielectric layer;

removing an exposed portion of the lower dielectric layer;

forming a gate structure around the plurality of fins and on the lower spacer layer; and doping portions of the plurality of fins corresponding to the lower spacer layer, wherein the doping comprises diffusing a dopant from the lower dielectric layer into the portions of the plurality of channel fins.

19. The method according to claim 18, wherein the lower dielectric layer comprises at least one of PSG (phospho-silicate glass), BSG (boro-silicate glass) and BPSG (boro-phospho-silicate glass).

20. The method according to claim 19, further comprising:

recessing the gate structure;

conformally forming an upper dielectric layer on the plurality of fins and on the recessed gate structure; and forming an upper spacer layer on a portion of the upper dielectric layer.

* * * * *